United States Patent [19]

Yoneda et al.

[11] Patent Number: 5,420,450
[45] Date of Patent: May 30, 1995

[54] SEMICONDUCTOR DEVICE HAVING STABLE BREAKDOWN VOLTAGE IN WIRING AREA

[75] Inventors: Tatsuo Yoneda, Tokyo; Kazuaki Suzuki, Kawasaki, both of Japan

[73] Assignee: Kabushiki Kaisha Toshiba, Kawasaki, Japan

[21] Appl. No.: 320,643

[22] Filed: Oct. 11, 1994

Related U.S. Application Data

[63] Continuation of Ser. No. 117,291, Sep. 7, 1993, abandoned.

[30] Foreign Application Priority Data

Sep. 10, 1992 [JP] Japan ................................. 4-241647

[51] Int. Cl.$^6$ ..................... H01L 29/10; H01L 29/78
[52] U.S. Cl. ................................. 257/341; 257/335; 257/336; 257/337; 257/339; 257/346; 257/401
[58] Field of Search ................. 257/329, 335, 336, 337, 257/339, 341, 346, 401

[56] References Cited

U.S. PATENT DOCUMENTS 4,920,388  4/1990  Blanchard et al. .................. 257/341

FOREIGN PATENT DOCUMENTS

| | | | |
|---|---|---|---|
| 0279403 | 8/1988 | European Pat. Off. . | |
| 59-49056 | 8/1984 | Japan | 257/339 |
| 60-171771 | 9/1985 | Japan | 257/339 |
| 63-84070 | 4/1988 | Japan | 257/341 |
| 63-252480 | 10/1988 | Japan | 257/339 |
| 64-769 | 1/1989 | Japan | 257/341 |
| 2-143566 | 6/1990 | Japan | 257/339 |

OTHER PUBLICATIONS

Patent Abstracts of Japan, vol. 14, No. 187 (E-0917), Apr. 16, 1990, & JP-A-2-35780, Feb. 6, 1990.
Patent Abstracts of Japan, vol. 17, No. 337 (E-1388), Jun. 25, 1993, & JP-A-5-41523, Feb. 19, 1993.
Patent Abstracts of Japan, vol. 5, No. 159 (E-77) [831], Oct. 14, 1981, & JP-A-56-88362, Jul. 17, 1981.
Patent Abstracts of Japan, vol. 6, No. 254 (E-148), Dec. 14, 1982, & JP-A-57-153468, Sep. 22, 1982.

*Primary Examiner*—Ngân V. Ngô
*Attorney, Agent, or Firm*—Oblon, Spivak, McClelland, Maier & Neustadt

[57] ABSTRACT

A semiconductor device having stable breakdown voltage in wiring area. The semiconductor has a first conducting type semiconductor substrate with a plurality of second conducting type first semiconductor regions formed on one part of the surface of the first conducting type semiconductor substrate. A first conducting type high density diffused second semiconductor region is formed on one part of the surface within the second conducting type first semiconductor region. A gate electrode material extends across one part of the surface of the first conducting type semiconductor substrate, where one part of the surface of the first conducting type high density diffused second semiconductor region and the second conducting type first semiconductor region are not formed. An insulating film covers the gate electrode material and a metal source wiring is connected to the first conducting type high density diffused second semiconductor region and the second conducting type first semiconductor region. A metal gate wiring is connected to one part of the surface of the gate electrode material through an open section provided in the insulating film, and second conducting type third semiconductor regions are formed as a plurality of partitions on the surface of the first conducting type semiconductor substrate on the lower part of the metal gate wiring. In the semiconductor device, the second conducting type third semiconductor region is positioned to approach the limit reached by a depletion layer extending from the second conducting type third semiconductor region toward the first conducting type semiconductor substrate.

7 Claims, 4 Drawing Sheets

FIG. 4A    FIG. 4B
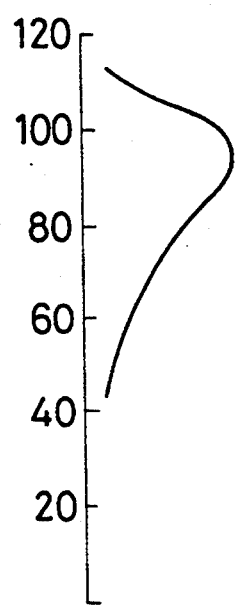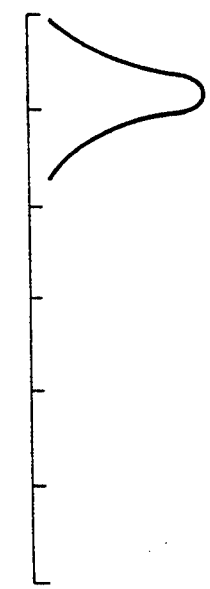
FIG. 5A    FIG. 5B
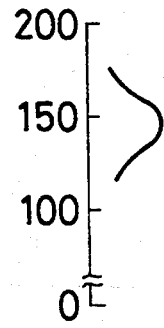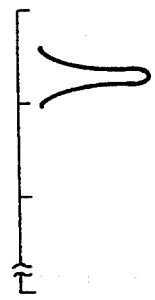

SEMICONDUCTOR DEVICE HAVING STABLE BREAKDOWN VOLTAGE IN WIRING AREA

This application is a Continuation of application Ser. No. 08/117,291, filed Sep. 7, 1993, now abandoned.

TECHNICAL FIELD

The present invention relates to a semiconductor device such as a MOS-type transistor or the like used mainly for electrical power, and, in particular, to a semiconductor device, provided with more stable insulation voltage resistance (or an insulating breakdown voltage) and a more stable breakdown voltage (or a drain-source breakdown voltage), which only requires a small amount of fabricating steps in the manufacture.

BACKGROUND ART

FIGS. 1A to 1D are configuration diagrams of a conventional semiconductor device in the form of a normal power MOSFET.

FIG. 1A is a plan view of the periphery of a section of aluminum gate wiring.

FIG. 1B is a sectional view (including a source region) when viewed along a section A–A'.

FIG. 1C is a sectional view (including a gate region) when viewed along a section B–B'.

FIG. 1D is a sectional view (including a source region and no P-type region) when viewed along a section A–A'.

Normally, the peripheral section of the aluminum gate wiring arranged on the surface of the semiconductor has a repetitive structure. A typical section is represented in FIG. 1A–1D.

On the surface of a MOSFET a high density silicon substrate 1 and a low density silicon substrate 2 act as a drain. A gate wiring under the P-type region 4 is formed by a special process under a gate wiring region (hereinafter referred to as a P-type region) positioned directly under a section of aluminum gate wiring 3.

The P-type region 4 provided on the upper surface of the silicon substrate 2 directly under the aluminum gate wiring 3 is formed continuously on the surface of the semiconductor, extending over the gate wiring in the wiring direction C (see FIGS. 1A and 1B).

Also, the P-type region 4 is connected to a section of aluminum source wiring 11 on the outer periphery (not shown) of the semiconductor device and has the same source potential.

Next, insulating oxidized gate films 5 are formed as insulating oxidized films, after which silicon gates 6 are formed.

After the desired patterning is performed, the silicon gates 6 are perforated by etching a unit cell portion.

A P-type base region 7 and a source region 8 are then formed by a self-aligning method to mask an open section of the silicon gate 6.

Finally, holes, specifically contact holes 10 and 12, are opened onto an insulating interlayer film 9 and the elements are connected through aluminum wiring.

The contact hole 10 connects the source region 8 and the P-type base region 7 of each unit cell to aluminum source wiring 11, and the contact hole 12 connects the silicon gate 6 to the aluminum gate wiring 3.

With the gate wiring under-structure of this conventional semiconductor device, the insulating oxidized gate film 5 is formed on the surface of the P-type region 4, and impurities from the P-type region 4 become incorporated in the insulating oxidized gate film 5 during various heating processes.

This creates the problem that the capability of an insulation voltage resistance of the insulating oxidized gate film 5 is reduced.

Normally, as shown in FIG. 1B, this problem is avoided by forming the insulating oxidized gate film 5 to an ample thickness in comparison with other film thicknesses by using a special process to selectively increase the film thickness. In FIG. 1B, a depletion layer is indicated by the reference number 13.

On the other hand, as shown in FIG. 1D, if the P-type region 4 is absent, a sudden change 14 in the curvature of a depletion layer 13 results because the under-section of the P-type region 4 would normally act as a connecting section for the depletion layer 13 which is formed on both sides of the P-type region 4.

Therefore, a localized breakdown is induced from electrostatic concentration so that the breakdown voltage (or a drain-source breakdown voltage between the drain section and the source section) is lowered.

As outlined above, with a conventional semiconductor device having tile configuration described above, the problem arises that the insulation voltage resistance of the insulating oxidized gate film 5 is reduced.

This problem is avoided by forming the insulating oxidized gate film 5 to an ample thickness in comparison with other film thicknesses, like the thicker P-type region 4 shown in FIG. 1C. However, a special process is necessary to selectively increase the film thickness, which is also a problem.

In addition, as shown in FIG. 1D, in the case where there is no P-type region directly under the aluminum gate wiring, a sudden change 14 is caused in the curvature of the depletion layer 13 so that the breakdown voltage (or the drain-source breakdown voltage) is lowered.

SUMMARY OF THE INVENTION

Accordingly, an object of the present invention is, with due consideration to the drawbacks of such conventional semiconductor devices, to provide a semiconductor device provided with a high quality insulating film and a more stable voltage resistance by forming a P-type region directly under a section of aluminum gate wiring as partitions, and by forming a unit cell section of the P-type region by the same process.

According to one feature of the present invention, a semiconductor device comprises:

a first conducting type semiconductor substrate;

a plurality of second conducting type first semiconductor regions formed on one part of the surface of said first conducting type semiconductor substrate;

a first conducting type high density diffused second semiconductor region formed on one part of the surface within said second conducting type first semiconductor region;

a gate electrode material extending across one part of the surface of said first conducting type semiconductor substrate, where one part of the surface of said first conducting type high density diffused second semiconductor region, and said second conducting type first semiconductor region are not formed;

an insulating film which covers said gate electrode material;

metal source wiring connected to said first conducting type high density diffused second semiconductor region, and said second conducting type first semiconductor region;

metal gate wiring connected to one part of the surface of said gate electrode material through an open section provided in said insulating film; and second conducting type third semiconductor regions formed as a plurality of partitions on the surface of said first conducting type semiconductor substrate on the lower part of said metal gate wiring, wherein said second conducting type third semiconductor region is positioned to approach the limit reached by a depletion layer extending from said second conducting type third semiconductor region to said first conducting type semiconductor substrate.

In the semiconductor device described above, said metal gate wiring connected to the gate electrode material is connected to said open section provided in the insulating film in a part inserted into said second conducting type third semiconductor region.

In addition, in the semiconductor device described above, the diffusion depth of said second conducting type third semiconductor region is equivalent to the diffusion depth of said second conducting type first semiconductor region.

According to another aspect of the present invention, a semiconductor device described above, wherein the spacing between said second conducting type third semiconductor region and said second conducting type first semiconductor region which is adjacent to said second conducting type third semiconductor region is the same as the spacing between said other second conducting type first semiconductor regions.

According to another aspect of the invention, in the semiconductor device, said second conducting type third semiconductor region is connected to the metal source wiring.

According to another aspect of the present invention, in the semiconductor device described above, said second conducting type third semiconductor region and said second conducting type first semiconductor region are formed by the same process.

Moreover, according to another aspect of the invention, in the semiconductor device described above, wherein the distance between adjacent said open sections provided in said insulating film is Ls+Lg, and the distance between adjacent open section which are provided in said insulating film and closed to the second conducting type third semiconductor region is an integer multiple of the length (Ls+Lg)+Ls, where Ls is a width of the open section, and Lg is the width of the gate electrode material.

BRIEF DESCRIPTION OF THE DRAWINGS

These and other objects, features, and advantages of the present invention will become more apparent from the following description of the preferred embodiments taken in S conjunction with the accompanying drawings, in which:

FIG. 2B is diagram for explaining a process for forming a P-type base region.

FIG. 2C is diagram for explaining a process for forming aluminum wiring.

FIG. 3B is diagram for explaining a process for forming a P-type base region.

FIG. 3C is a diagram for explaining a process for forming aluminum wiring.

FIG. 4A is a diagram for explaining the effect of a gate wiring under-section structure on the gate voltage resistance distribution for a conventional semiconductor device.

FIG. 4B is a diagram for explaining the effect of a gate wiring under-section structure on the gate voltage resistance distribution for a semiconductor device of the present invention.

FIG. 5A is a diagram for explaining the effect of a gate wiring under-section structure on distribution of a drain-source breakdown voltage (100 [V] system) for a conventional semiconductor device.

FIG. 5B is a diagram for explaining the effect of a gate wiring under-section structure on distribution of a drain-source breakdown voltage (100 [V] system) for a semiconductor device of the present invention.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

Before an explanation of the preferred embodiments of a semiconductor device of the present invention, features of the present invention will be described.

Figure 1A:
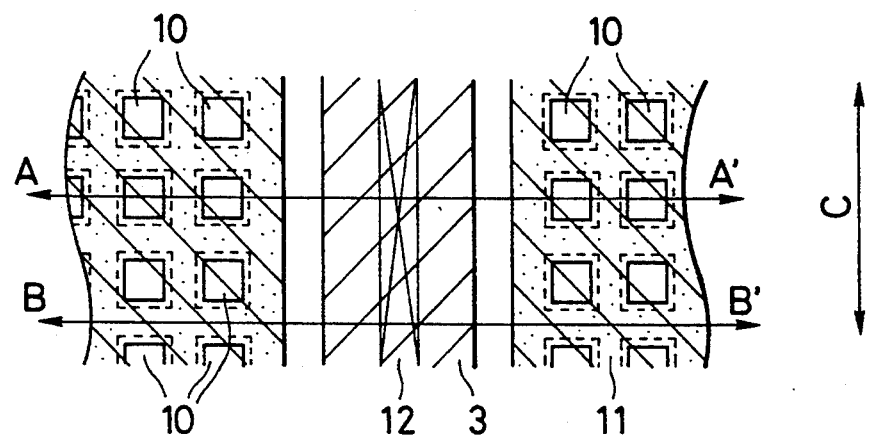
FIG. 1A is a plan view of the periphery of aluminum gate wiring for a conventional semiconductor device.
Figure 1B:
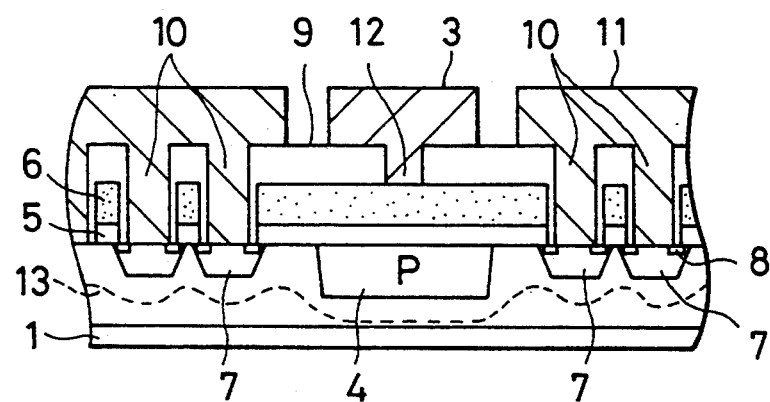
FIG. 1B is a sectional view (including a source region) when viewed along a section A-A'.
Figure 1C:
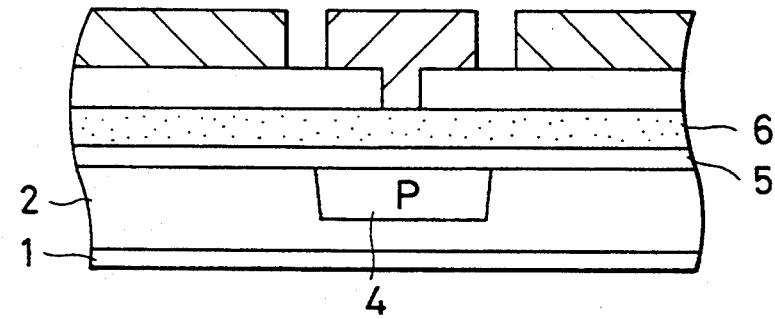
FIG. 1C is a sectional view (including a gate region) when viewed along a section B-B'.
Figure 1D:
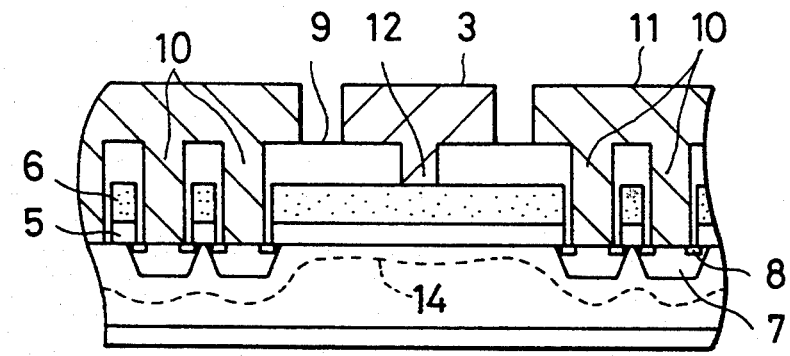
FIG. 1D is a sectional view(including a source region and no P-type region) when viewed along a section A-A '.
Figure 2A:
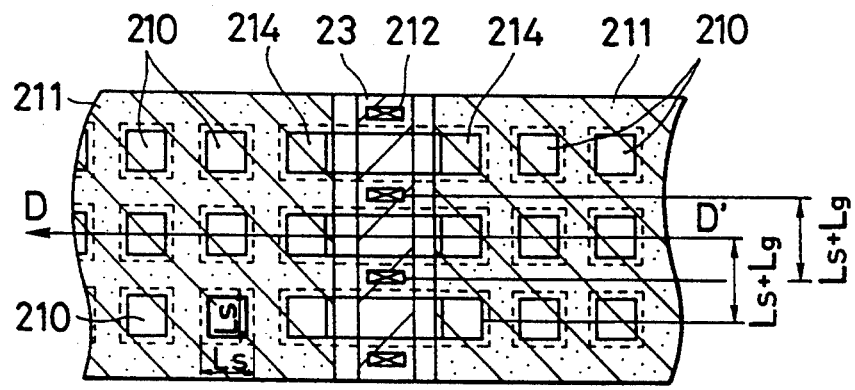
FIG. 2A is a plan view of a semiconductor device of the present invention.
Figure 2B:
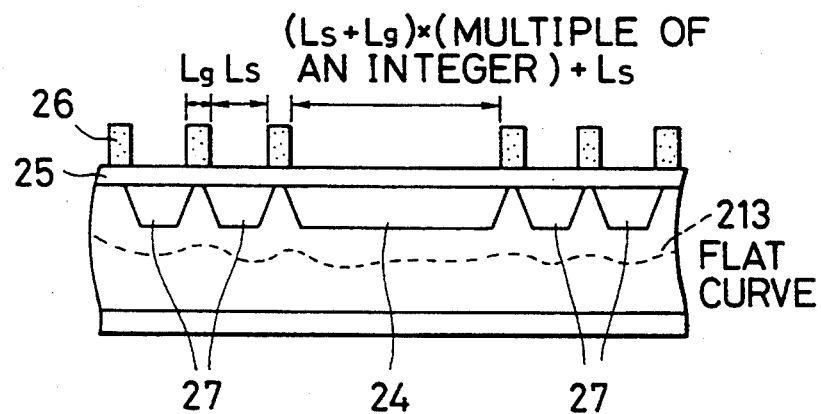
FIG. 2B and FIG. 2C are sectional views (on a source region) when viewed along a section D-D'.
Figure 2C:
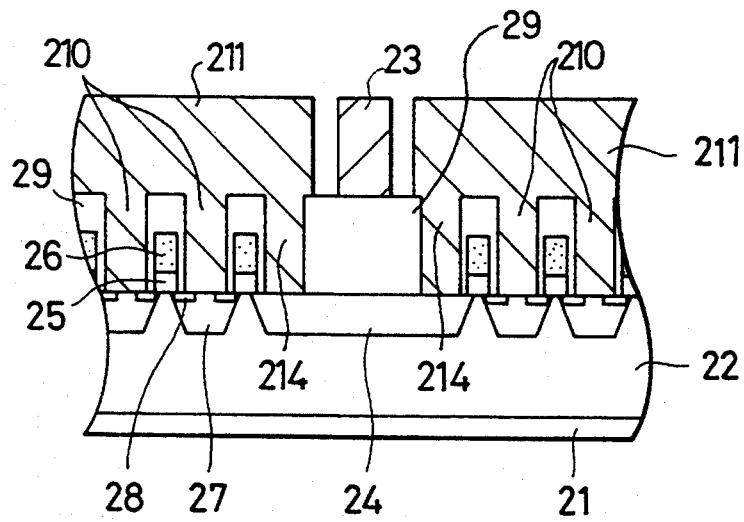

A first feature of an embodiment of the semiconductor device of the present invention, as shown in FIGS. 2A to 2C, is that a plurality of second conducting type third semiconductor regions 24 is formed as partitions on the surface of a pair of first conducting type semiconductor substrates 21 and 22 on the under-portion of a section of metal gate wiring 23.

Furthermore, the second conducting type third semiconductor region 24 is positioned to approach the limit reached by a depletion layer 13 extending from the second conducting type third semiconductor region 24 toward the first conducting type semiconductor substrates 21, 22.

Specifically, during the formation of the second conducting type third semiconductor region 24 on the under-portion of the metal gate wiring 23, the second conducting type third semiconductor region 24 is formed from a diffusion window opened In a lattice shape in a gate electrode material 26 formed on an insulating film 25.

The quality of the insulating film 25 can be improved, and an insulation voltage resistance(or an insulation breakdown voltage) can be improved.

In addition, the change in curvature of the depletion layer 213 on the lower section of the second conducting type third semiconductor region 24 can be reduced so that more stable breakdown voltage (or a drain-source breakdown voltage) characteristics can be provided.

A second feature of the embodiment of the present invention is that the metal gate wiring 23 connected to the gate electrode material 26 is connected at an open section 212 of an insulating film 29 provided on a part inserted into the second conducting type third semiconductor region 24.

For example, as shown in FIG. 2A if, when the width of the opening in a silicon gate in a unit cell section is Ls, and the width of the silicon gate between the unit cells is Lg, the spacing of the opening section 212 is centered to equal Ls+Lg, then it is possible to configure the device uniformly.

The fabricating process then becomes simple, and more stable breakdown voltage (or a drain-source breakdown voltage) characteristics can be provided.

A third feature of the embodiment of the semiconductor device of the present invention is that the diffusion depth of the second conducting type-third semiconductor region 24 is formed to be equivalent to the diffusion depth of a second conducting type first semiconductor region 27.

As a result, the change In curvature of the depletion layer 213 on the lower section of the second conducting type third semiconductor region 24 can be reduced so that more stable breakdown voltage (or a drain-source breakdown voltage) characteristics can be provided.

A fourth feature of the embodiment of the semiconductor device of the present invention is that the spacing between the second conducting type third semiconductor region 24 and the second conducting type first semiconductor region 27, which is adjacent to the second conducting type third semiconductor region 24, is the same as the spacing between the other second conducting type first semiconductor regions 27.

As a result, it is possible to configure the device uniformly. The manufacturing process then becomes simple, and more stable breakdown voltage (or a drain-source breakdown voltage) characteristics can be provided.

A fifth feature of the embodiment of the semiconductor device of the present invention is that the second conducting type third semiconductor region 24 is connected to a section of aluminum source wiring 211.

As a result, the second conducting type third semiconductor region 24, on which a channel region is not formed, acts as a source electrical potential and can be positively used as a Junction diode formed between drain sources.

For example, it is possible to obtain a favorable structure for a destruction mode produced during recovery operation.

Finally, a sixth feature of the embodiment of the semiconductor device of the present invention is that the second conducting type third semiconductor region 24 and the second conducting type first semiconductor region 27 are formed by the same process.

For example, using the same diffusion process, the same diffusion depth is created for the region 24 and the region 27, and by using a shorter process, a semiconductor device with more stable breakdown voltage (or a drain-source breakdown voltage) characteristics can be provided.

FIGS. 2A to 2C and FIGS. 3A to 3C are configuration diagrams of one embodiment of the semiconductor device of the present invention.

FIG. 2A is a plan view of a semiconductor device of the present invention.

FIG. 2B and FIG. 2C are sectional views (on a source region) when viewed along a section D-D'.

FIG. 2B is diagram for explaining a process for forming a P-type base region.

FIG. 2C is diagram for explaining a process for forming aluminum wiring.

Figure 3A:
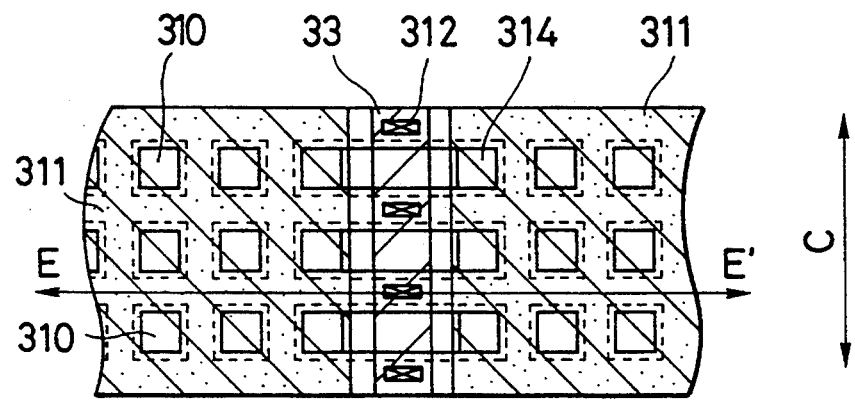
FIG. 3A is a plan view of a semiconductor device of the present invention.

FIG. 3A is a plan view of a semiconductor device of the present invention.

Figure 3B:
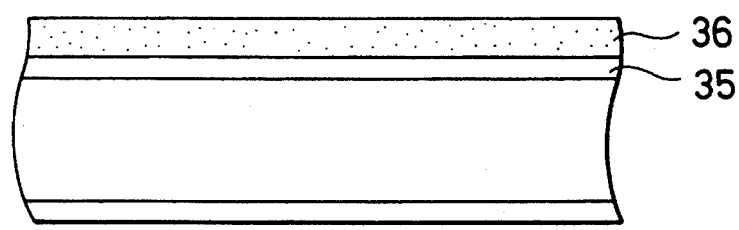
FIG. 3B and FIG. 3C are sectional views (on a gate contact hole) when viewed along a section E-E'.
Figure 3C:
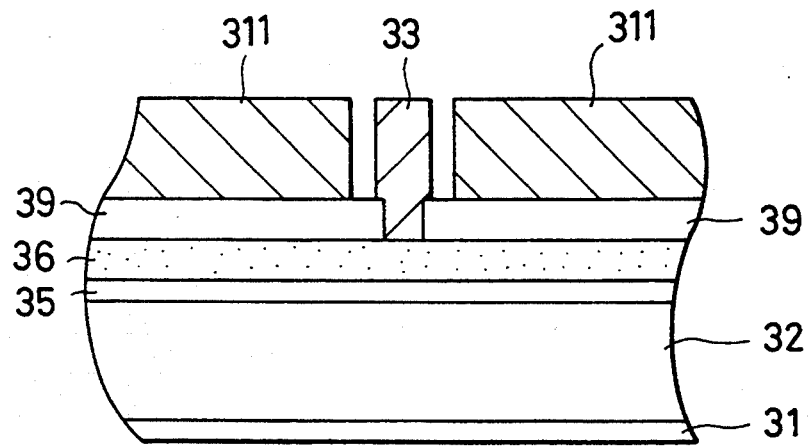

FIG. 3B and FIG. 3C are sectional views (on a gate contact hole) when viewed along a section E-E'.

FIG. 3B is a diagram for explaining a process for forming a P-type base region.

FIG. 3C is a diagram for explaining a process for forming aluminum wiring.

The explanation of this embodiment will be given in relation to an N-channel MOSFET, for convenience.

Also, silicon gates 26 are used in this embodiment because a normal polysilicon is utilized.

A high density silicon substrate 21 and a low density silicon substrate 22 are used as the drain of the MOSFET.

On the surface of the MOSFET, first, an insulated oxidized gate film 25 and the polysilicon gates 26 are formed. Then, diffusion windows 210 and 214 for forming a P-type region 24 are provided by polysilicon etching. At this time, the wiring under-section P-type region diffusion window 214, which is not continuous in the wiring direction, is formed in a plurality of locations on a ladder (see FIG. 2A). This is one of the features of the present invention.

In addition, when the silicon gate opening width in the unit cell section is Ls and the silicon gate width between the unit cells is Lg, a diffusion window with a width Ls, an integer multiple of the length (Ls+Lg)+Ls, is arranged at a spacing Ls+Lg, positioned in the shape desired for the wiring under-section P-type region diffusion window 214.

As a result, a maximum effect is obtained because the arrangement of the other FET parts is not disturbed.

Next, P-type regions 24 and 27 are formed by a self-aligning method to mask the polysilicon gates 6 as shown in FIG. 2B.

Specifically, The P-type region 24 and the P-type region 27 are formed by the same diffusion process to the same diffusion depth. This is another feature of the present invention.

A source region 28 is formed by conventional technology such as a ion implantation method in each of the unit cells, with the exception of the P-type region 24. No channel region is formed in the P-type region 24.

Finally, an insulating interlayer film 29 is formed on the polysilicon gate 26, a contact hole is opened for connecting the aluminum wiring, and the wiring is installed.

Specifically, the two terminals of the P-type region 24 are connected to aluminum source wiring 211 and connected to a source electrode (see FIG. 2C). Also, aluminum gate wiring 23 is connected to the polysilicon gate 26 in a contact hole 212 on the cross-section B-B', inserted into the wiring under-section P-type region diffusion window 14 (see FIG. 3C).

Here, it is preferable that the gate contact holes 212 be positioned between the wiring under-section P-type region diffusion windows 214 at a spacing of Ls+Lg.

The excellent voltage resistance characteristics of this embodiment of the semiconductor of the present invention will now be explained with reference to FIGS. 4A and 4B and FIGS. 5A and 5B.

FIGS. 4A and 4B are diagrams for explaining the effect of a gate wiring under-section structure on the gate voltage resistance distribution when the thickness of the insulating gate film is 1200 Angstrom.

The distribution is for a number of insulating gate film breakdown voltages [V] when the gate sources or the drain sources are shorted, when applying a voltage across the gate sources.

FIGS. 5A and 5B are diagrams for explaining the effect of a gate wiring under-section structure on the drain-source breakdown voltage distribution (100 [V] system).

The distribution is for a number of breakdown voltages [V] when a voltage is applied across the drain sources.

In each case, (1) represents a conventional device; (2) represents a device of the present embodiment.

As shown in FIGS. 4A and 4B and FIGS. 5A and 5B, as compared to the conventional example, this embodiment shows an improvement in both the insulating gate film breakdown voltage and the breakdown voltage.

In addition, more stable voltage resistant characteristics are obtained.

The above-mentioned embodiment was explained for an N-channel MOSFET, but obviously the present invention can also be applied to all other MOS-type transistors such as a P-channel MOSFET, or an IGBT (Insulated Gate Bipolar Transistor).

Also, polysilicon was used in the above explanation as a structural member for purposes of convenience only and is not limitative of the present invention which can be applied to all silicon gates.

By means of the present invention as outlined above, the second conducting type third semiconductor region of the metal gate wiring under-section is formed from the diffusion window opened in a lattice shape in the gate electrode material formed on the insulating film, therefore the quality of the insulating film can be improved and the insulation voltage resistance (or the drain-source breakdown voltage) can be improved.

In addition, the change in curvature of the depletion layer on the lower section of the second conducting type third semiconductor region can be reduced so that a semiconductor device with more stable breakdown voltage (or the drain-source breakdown voltage) characteristics can be provided.

Also, by means of the present invention, the metal gate wiring connected to the gate electrode material is connected at the open section of the insulating film provided on a part inserted into the second conducting type third semiconductor region, and the open section is positioned so as to be evenly space around the center, so that the device is evenly spaced.

The manufacturing process then becomes simple, and a semiconductor device with more stable breakdown voltage (or the drain-source breakdown voltage) characteristics can be provided.

Also, by means of the present invention, the diffusion depth of the second conducting type third semiconductor region is formed to be equivalent to the diffusion depth of the second conducting type first semiconductor region. Therefore, the change in curvature of the depletion layer on the lower section of the second conducting type third semiconductor region can be reduced so that a semiconductor device with more stable breakdown voltage (or the drain-source breakdown voltage) characteristics can be provided.

By means of the present invention, the spacing between the second conducting type third semiconductor region and the adjacent second conducting type first semiconductor region is the same as the spacing between the other second conducting type first semiconductor regions. As a result, it is possible to configure the device uniformly.

The manufacturing process then becomes simple, and a semiconductor device with more stable breakdown voltage (or the drain-source breakdown voltage) characteristics can be provided.

Also, by means of the present invention, the second conducting type third semiconductor region is connected to the aluminum source wiring, and, the second conducting type third semiconductor region, on which a channel region is not formed, acts as a source potential so that it can be positively used as a junction diode formed between drain sources.

For example, it is possible to provide a semiconductor device with a favorable structure for a destruction mode produced during recovery.

In addition, by means of the present invention, the second conducting type third semiconductor region and the second conducting type first semiconductor region are formed by the same process. For example, with the same diffusion process, the same diffusion depth is created for the regions, and a semiconductor device with more stable breakdown voltage (or the drain-source breakdown voltage) characteristics is provided and manufactured by a shorter process.

What is claimed is:

1. A semiconductor device having stable breakdown voltage in a wiring area, comprising:
   a first conducting type semiconductor substrate (21 and 22) having a major surface;
   a plurality of second conducting type first semiconductor regions (27) embedded into the major surface of said semiconductor substrate (21,22);
   a plurality of first conducting type high density diffused second semiconductor regions (28) embedded within each of said second conducting type first semiconductor regions (27);
   a first insulating film (25) formed on said first semiconductor regions (27) and said semiconductor substrate (2, 22);
   a gate electrode material (26) formed on said first insulating film (25) and formed over adjacent second semiconductor regions (28), said gate electrode material (26) not being in contact with each of said first conducting type high density diffused second semiconductor regions (28) and not being in contact with said second conducting type first semiconductor regions (27);
   a second insulating film (29) which covers said gate electrode material (26);
   metal source wiring (211) connected to each of said first conducting type high density diffused second semiconductor regions (28) and connected to each of said second conducting type first semiconductor regions (27);
   a plurality of second conducting type third semiconductor regions (24) embedded into the major surface of said semiconductor substrate (21, 22), the thickness of said third semiconductor region being substantially equal to the thickness of said second conducting type first semiconductor regions (27), said insulating film (29) also covering a portion of said second conducting type third semiconductor region (24) and covering a portion of the major surface between each adjacent said second type third semiconductor regions (24); said second conducting type third semiconductor regions (24) being connected electrically to said metal source wiring (211);

metal gate wiring (23) formed on said insulating film (29) and formed over said second conducting type third semiconductor region (24), and connected to said gate electrode material through open sections provided in said insulating film (29) at a point along the major surface of the semiconductor substrate between adjacent said second conducting type third semiconductor regions; and wherein a diffusion depth of said second conducting type third semiconductor regions (24) is substantially equal to the diffusion depth of said second conducting type first semiconductor regions (27), and said first conducting type high density diffused second semiconductor regions (28) are not formed in said second conducting type third semiconductor regions (24).

2. A semiconductor device as claimed in claim 1, wherein said metal gate wiring is connected electrically to the gate electrode material through said open section in the insulating film between each of said second conducting type third semiconductor regions on the semiconductor substrate.

3. A semiconductor device as claimed in claim 1, wherein a spacing between said second conducting type third semiconductor regions and said second conducting type first semiconductor regions is the same as a spacing between a pair of said second conducting type first semiconductor regions which are adjacent to each other.

4. A semiconductor device as claimed in claim 1, wherein a width (Ls) of any of said second conducting type third semiconductor regions is substantially equal to a width of any of said second conducting type first semiconductor regions.

5. A semiconductor device as claimed in claim 1, wherein a distance between adjacent said open sections is Lg, and a distance between any of said open sections and any of said second conducting type third semiconductor regions is ((Ls+Lg)×M+Ls) wherein Ls is a width of said open section, Lg is a width of said gate electrode material, and M is an integer multiple.

6. A semiconductor device according to claim 1, wherein the second conducting type third semiconductor regions being positioned in the major surface of the semiconductor substrate such that a depletion region has a constant depth in the semiconductor substrate.

7. A semiconductor device having stable breakdown voltage in a wiring area, comprising:

a semiconductor substrate (21 and 22) of a first conducting type and having a major surface;

a plurality of first semiconductor regions of a second conducting type embedded into the major surface of said semiconductor substrate (21, 22), positioned in the major surface adjacent to each other such that a depletion layer in the semiconductor substrate is constant between any of the first semiconductor regions;

a plurality of second semiconductor regions of high density diffused material of the first conducting type embedded within each of said first semiconductor regions;

a plurality of elongated third semiconductor regions of the second conducting type embedded within the major surface of the semiconductor substrate, each of the third semiconductor regions having a longitudinal axis and two ends, each longitudinal axis parallel to any other longitudinal axis, said first semiconductor regions situated adjacent to the two ends;

a gate electrode material (26) formed over the major surface of said semiconductor substrate, the gate electrode material (26) not being in contact with each of said second semiconductor regions (28);

an elongated insulating film (29) positioned on the major surface of the semiconductor substrate forming a plane perpendicular to any of said longitudinal axis of the third semiconductor regions and forming one continuous layer covering a portion of each of the third semiconductor regions;

metal source wiring (211) connected to said second semiconductor regions (28) and to the two ends of each of the third semiconductor regions (24);

metal gate wiring (23) deposited on the elongated insulating film (29) and connected to gate electrode material (26) through open sections in the insulating film such that there is no said third semiconductor regions below the metal gate wiring where the metal gate wiring connects to the gate electrode material; and wherein a diffusion depth of said third semiconductor regions is substantially equal to the diffusion depth of the first semiconductor regions, the first semiconductor regions and the third semiconductor regions are positioned such that the depletion layer has a constant depth within the semiconductor substrate, and said second semiconductor region (28) is not formed in said third semiconductor region (24).

* * * * *